United States Patent [19]
Shintani et al.

[11] Patent Number: 6,076,483
[45] Date of Patent: *Jun. 20, 2000

[54] PLASMA PROCESSING APPARATUS USING A PARTITION PANEL

[75] Inventors: Kenji Shintani; Masakazu Taki; Hiroki Ootera; Kazuyasu Nishikawa, all of Hyogo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/048,067

[22] Filed: Mar. 26, 1998

[30] Foreign Application Priority Data

Mar. 27, 1997 [JP] Japan ................... 9-076029

[51] Int. Cl.⁷ .................................. C23C 16/00
[52] U.S. Cl. ........................ 118/723 MA; 118/723 ER; 118/723 E; 156/345
[58] Field of Search ............... 118/723 ER, 723 MA, 118/723 E; 156/345; 315/111.21

[56] References Cited

U.S. PATENT DOCUMENTS

| | | | |
|---|---|---|---|
| 4,943,361 | 7/1990 | Kakehi et al. | 204/192.32 |
| 5,108,535 | 4/1992 | Ono et al. . | |
| 5,133,825 | 7/1992 | Hakamata et al. | 156/345 |
| 5,279,669 | 1/1994 | Lee | 118/723 MR |
| 5,476,182 | 12/1995 | Ishizuka et al. | 216/68 |
| 5,665,167 | 9/1997 | Deguchi et al. | 118/728 |
| 5,695,597 | 12/1997 | Fujiwara | 156/345 |

FOREIGN PATENT DOCUMENTS

| | | |
|---|---|---|
| 51-88182 | 8/1976 | Japan . |
| 58-204538 | 11/1983 | Japan . |
| 2-9452 | 1/1990 | Japan . |
| 2-94520 | 4/1990 | Japan . |
| 4-72082 | 3/1992 | Japan . |
| 5-283372 | 10/1993 | Japan . |
| 7-122543 | 5/1995 | Japan . |
| 7-263353 | 10/1995 | Japan . |
| 7-283203 | 10/1995 | Japan . |
| 8-111402 | 4/1996 | Japan . |

OTHER PUBLICATIONS

A. Van Oostrom vol. 17 No. 5, Sep. 1,1970, "Field–Induced surface Rearrangement in a Field–Ion Microscope" pp. 206–208.

Shinichi Tachi et al., Feb. 1988, "Low–Temperature Reactive Ion Etching and Microwave Plasma Etching of silicon" pp. 616–618.

A. M. Barklund et al. Received Sep. 17, 1990 accepted Dec. 14, 1990 "Plasma Jet Dry Etching Using Different Electrode Configurations".

*Primary Examiner*—Kathryn Gorgos
*Assistant Examiner*—Wesley A. Nicolas
*Attorney, Agent, or Firm*—McDermott, Will & Emery

[57] ABSTRACT

A plasma processing apparatus has a plurality of annular permanent magnets arranged concentrically with the same polarity in the circumferential direction at the atmosphere side of a second electrode arranged opposite to a stage on which a specimen is placed. Arrangement is provided so that the magnets located adjacent radially have opposite polarity. Furthermore, permanent magnets are arranged at the outer circumference of a vacuum vessel corresponding to a plasma generation chamber portion. A plasma processing apparatus can be provided that allows formation of uniform plasma over a large area and uniform processing of a specimen of a large diameter.

4 Claims, 10 Drawing Sheets

H=50

PLASMA PROCESSING APPARATUS USING A PARTITION PANEL

BACKGROUND OF THE INVENTION

1. Field of the Invention

The present invention relates to plasma processing apparatuses, and more particularly, to a plasma processing apparatus that forms a thin film on the surface of an object of interest or that etches the surface of an object taking advantage of plasma.

2. Description of the Background Art

FIG. 9 is a schematic sectional view of a conventional plasma processing apparatus disclosed in, for example, Japanese Patent Laying-Open No. 2-9452. Referring to FIG. 9, the conventional plasma apparatus includes a vacuum vessel 101, a first electrode 103 on which an object 102 to be processed is placed, and a second electrode 104 arranged opposite to first electrode 103.

Etching gas is introduced through a gas inlet 105 into vacuum vessel 1 and exhausted through an exhaust port 106. A high frequency power source 107 is connected to first electrode 103 via a matching circuit 108. A permanent magnet 109 is arranged at the atmosphere side of second electrode 104. A cooling mechanism 110 is connected to first electrode 103. In FIG. 9, E indicates the electric field and B is the component of the magnetic field induced by magnet 109, parallel to first electrode 103.

The operation of the plasma processing apparatus of the above structure will be described hereinafter. When etching gas is introduced into the plasma chamber of vacuum vessel 101 from gas inlet 105, plasma is generated between first and second electrodes 103 and 104 by the high frequency power applied to first electrode 103.

The apparatus shown in FIG. 9 is directed to achieve high electron density even at a low pressure by magnetron discharge. The apparatus of FIG. 9 is set so that the magnetic flux density at the surface of first electrode 103 is approximately 200 G.

At the sheath region (the region where plasma is in contact with first electrode 103), the charged particles (electrons and ions) drift in the direction of E×B while moving cycloidally under the influence of the sheath electric field and magnetic field.

As a result, the probability of collision between an electron and a neutron (molecule, atom) increases to promote ionization. Accordingly, plasma of high density is generated even at a low pressure to achieve a high etching rate. In this case, plasma loss is reduced by the magnetic field caused by permanent magnet 109. Therefore, the high density plasma is maintained to allow etching of object 102 of interest.

It is now necessary to generate uniform plasma over a large area for the purpose of processing objects of large diameter such as 8 inches or 10 inches in size. However, the magnetic flux density in the lateral direction (parallel between electrodes) at the surface of second electrode 104 of the above-described plasma processing apparatus with the arrangement of a single permanent magnet is low at the center and becomes higher uniformly in the radial direction as shown in FIG. 10(B). The overall magnetic flux density is not uniform. It is therefore difficult to form a magnetic field of uniform intensity in the proximity of the object to be processed.

It is not easy to generate plasma uniformly despite its homogeneous action by diffusion. FIG. 10(A) shows a permanent magnet of 200 mm in diameter and 50 mm in height with the surface magnetic flux density entirely uniform at 3 kG. FIG. 10(B) is a graph of the magnetic field distribution in the lateral direction at the surface of second electrode 104 remote from the permanent magnet of FIG. 10(A) by 35 mm. The magnetic field intensity $B \perp$ (G) in the lateral direction is plotted along the ordinate, and the distance $r$(mm) from the center is plotted along the abscissa.

The magnetic field distribution at the surface of the object to be processed placed on first electrode 103 is also not uniform. Since the movement of a charged particle is greatly affected by the magnetic field distribution, the flux of the incident charged particles at the surface of the object to be processed is also not uniform, reflecting the nonuniform magnetic field distribution. As a result, the distribution of the charge density is disturbed at the surface of the object to be processed to damage the device.

In the event that a plurality of permanent magnets are used, the magnetic field distribution will be nonuniform similar to the above case with a single magnet if the permanent magnets are arranged so that adjacent magnets have the same polarity. Therefore, the uniformity of the plasma will not be sufficient even if the homogeneous action by plasma diffusion is taken into account.

The aforementioned Japanese Patent Laying-Open No. 2-9452 also discloses arrangement of a plurality of rod-like permanent magnets with the polarity between adjacent magnets being the opposite, as shown in the sectional view of FIG. 11(A). When the polarity is altered alternately, the distribution in the radial direction of the lateral magnetic flux density $B \perp$ at the surface of second electrode 104 is indicated by the waveform of FIG. 12(B) according to the arrangement of permanent magnets 109 of FIG. 12(A).

It is appreciated from FIGS. 12(A) and 12(B) that the position of the peak can be controlled by altering the distance between the magnets although $B \perp$ is not uniform radially. Homogeneity can be achieved by generating the plasma in such a magnetic field coordination since the plasma is spread by diffusion even to the region where the magnetic field is weak. Because of reduction in loss in contrast to the case where there is no magnet, uniform plasma of high density can be obtained.

In the parallel arrangement of a plurality of rod-like permanent magnets 109 as shown in FIG. 11(A), magnetic fields $B_1$ and $B_2$ are generated as shown in FIG. 11(B). At region (A) in the proximity of the object to be processed, the plasma drifts in the direction piercing the plane of the drawing sheet by the E×B drift caused by electric field E and magnetic field $B_1$. At the region of (B), plasma drifts in the opposite direction by electric field E and magnetic field $B_2$ to become locally dense.

Focusing on the movement of the charged particles at the sheath portion at the surface of second electrode 104, the direction of drift (indicated by arrows) differs for every pair of adjacent permanent magnets 109 due to the E×B drift as shown in FIG. 13. The region of the shaded area indicated by X in the drawing has high density due to the high plasma density portion corresponding to the direction of the drift. As a result, nonuniformity occurs in the plasma density with the parallel arrangement. This means that uniformity in the etching rate is degraded. This is a critical problem in the parallel arrangement of permanent magnets.

FIG. 14 shows a schematic structure of another conventional plasma processing apparatus having the plasma generation chamber and the processing chamber divided. Such a plasma processing apparatus is disclosed in Japanese Patent Laying-Open No. 51-88182, for example. Referring to FIG. 14, a processing chamber 121 is evacuated by a diffusion pump 132 via a main valve 131 and an auxiliary rotary pump 133. A plasma generation chamber 122 is provided above processing chamber 121. Counter electrodes 118 and 119 are connected to ground at plasma generation chamber 122. Counter electrode 119 with a plurality of holes 20 is provided as a partition wall to divide plasma generation chamber 122 and processing chamber 121. A raw material gas cylinder 134 is connected to a gas conduit 115.

The operation of the plasma processing apparatus of the above structure will be described hereinafter. The etching gas introduced into plasma generation chamber 122 through gas conduit 115 passes through processing chamber 122 to be output by a vacuum pump. Difference in pressure between plasma generation chamber 122 and processing chamber 121 is generated by the conductance of holes 120 provided between plasma generation chamber 122 and processing chamber 121.

According to specific figures disclosed in the prior art, the pressure of plasma generation chamber 122 is maintained at $1\sim5\times10^{-1}$ Torr and the pressure of processing chamber 121 is maintained at not more than $1\times10^{-3}$ Torr under the conditions of seven holes each having a diameter of 0.1–0.8 mm at the effective evacuation rate of 1000 L/sec. of the exhaust system and the flow rate of 50–100 cc/min. of the raw material gas.

By supplying a high frequency power to counter electrodes 118 and 119 by a high frequency power source 117, plasma is generated in plasma generation chamber 122. The plasma passes through holes 120 to etch object 102 placed on a table 126 in processing chamber 121.

In the plasma processing apparatus of the above structure, the plasma generated at plasma generation chamber 122 by the parallel-plate high frequency discharge had the density of $5\times10^8$ (particles/cm$^3$) to $5\times10^9$ (particles/cm$^3$). The processing speed of object 102 is relatively proportional to the density of incident plasma towards object 102. Limitation in the generated plasma density prevents the object of interest to be processed at high speed since plasma of high density cannot be introduced into processing chamber 121. Also, the pressure in plasma generation chamber 122 maintained by the parallel-plate high frequency discharge is approximately 0.1 Torr. Thus, there was a problem that the object cannot be processed at an atmosphere under a high vacuum.

In the conventional plasma processing apparatus having a single magnet arranged as in FIG. 9, the magnetic flux density increases uniformly from the center radially. Therefore, a uniform magnetic field distribution cannot be provided. Therefore, nonuniformity is exhibited in plasma density.

In the plasma processing apparatus having a plurality of magnets arranged in parallel with alternate polarity between adjacent magnets as shown in FIGS. 11(A) and 11(B), the drifting direction differs for every pair of adjacent magnets. An area of high plasma density is generated in the drifting direction to result in nonuniform plasma density. There was a problem that an object of a large area could not be etched uniformly.

In the plasma processing apparatus having separate plasma generation and processing chambers as shown in FIG. 14, the density of the plasma generated in the plasma generation chamber is low. Therefore, plasma of high density cannot be introduced into the processing chamber. As a result, the process cannot be carried out at high speed. There was also a problem that the object cannot be processed at the atmosphere under a high vacuum if the plasma density is increased.

SUMMARY OF THE INVENTION

An object of the present invention is to provide a plasma processing apparatus that can form plasma uniformly over a large area and that can process an object of a large diameter uniformly.

Another object of the present invention is to provide a plasma processing apparatus with a higher density of plasma generated at a plasma generation chamber to carry out high speed processing in a high vacuum atmosphere.

A further object of the present invention is to provide a plasma processing apparatus that can generate plasma of high density uniformly over a large area, and that can process an object of a large diameter at a uniform high speed in a high vacuum atmosphere.

According to an aspect of the present invention, a plasma processing apparatus includes a processing chamber having a first electrode on which an object to be processed is mounted in a vacuum vessel, a plasma generation chamber having a second electrode arranged opposite to the first electrode in the vacuum chamber, a partition panel provided between the processing chamber and the plasma generation chamber, having a hole communicating therebetween, and a magnetic field generation device provided outside the vacuum vessel for generating a magnetic field in the vacuum chamber.

By providing a magnetic field generation device outside the vacuum vessel to generate a magnetic field inside the vacuum vessel, plasma can be diffused by the magnetic field in the plasma generation chamber. As a result, the plasma spreads to allow homogeneity of the plasma.

Preferably, the magnetic field generation device includes a plurality of N-pole permanent magnets and S-pole permanent magnets arranged alternately on the outer circumference of the vacuum vessel at the plasma generation chamber.

By this alternate arrangement of N-pole and S-pole permanent magnets, a line of magnetic force from the N pole to the S pole can be generated in the proximity of the inner wall of the plasma generation chamber. The plasma generated in the plasma generation chamber is attracted to this magnetic field. As a result, the plasma spreads to allow homogeneity of plasma.

Preferably, the magnetic field generation device includes a plurality of permanent magnets having the N pole arranged at the second electrode side and the S pole arranged at the first electrode side on the outer circumference of the vacuum vessel at the plasma generation chamber.

By the alternate arrangement of a plurality of permanent magnets with the N pole at the second electrode side and the S pole at the first electrode side, a line of magnetic force can be generated towards the first electrode side from the second electrode side in the proximity of the inner wall of the plasma generation chamber. The plasma generated in the plasma generation chamber is attracted towards the magnetic field, and also directed towards the first electrode side from the second electrode side. Thus, plasma of high density can be introduced into the processing chamber. Surface treatment of an object to be processed can be carried out at high speed.

Preferably, the magnetic field generation device includes a divergent magnetic field coil on the outer circumference of the vacuum vessel corresponding to the partition panel portion.

The provision of a divergent magnetic field coil allows generation of a line of magnetic force towards the first electrode side from the area of the second electrode in the vacuum vessel. The plasma generated in the plasma generation chamber is attracted towards the magnetic field, and also directed towards the first electrode side from the second electrode side. As a result, plasma of high density can be introduced into the processing chamber. A surface treatment of an object to be processed can be carried out at high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An etching apparatus will be described hereinafter with reference to the drawings as an embodiment of a plasma processing apparatus of the present invention.

First Embodiment

Figure 1:
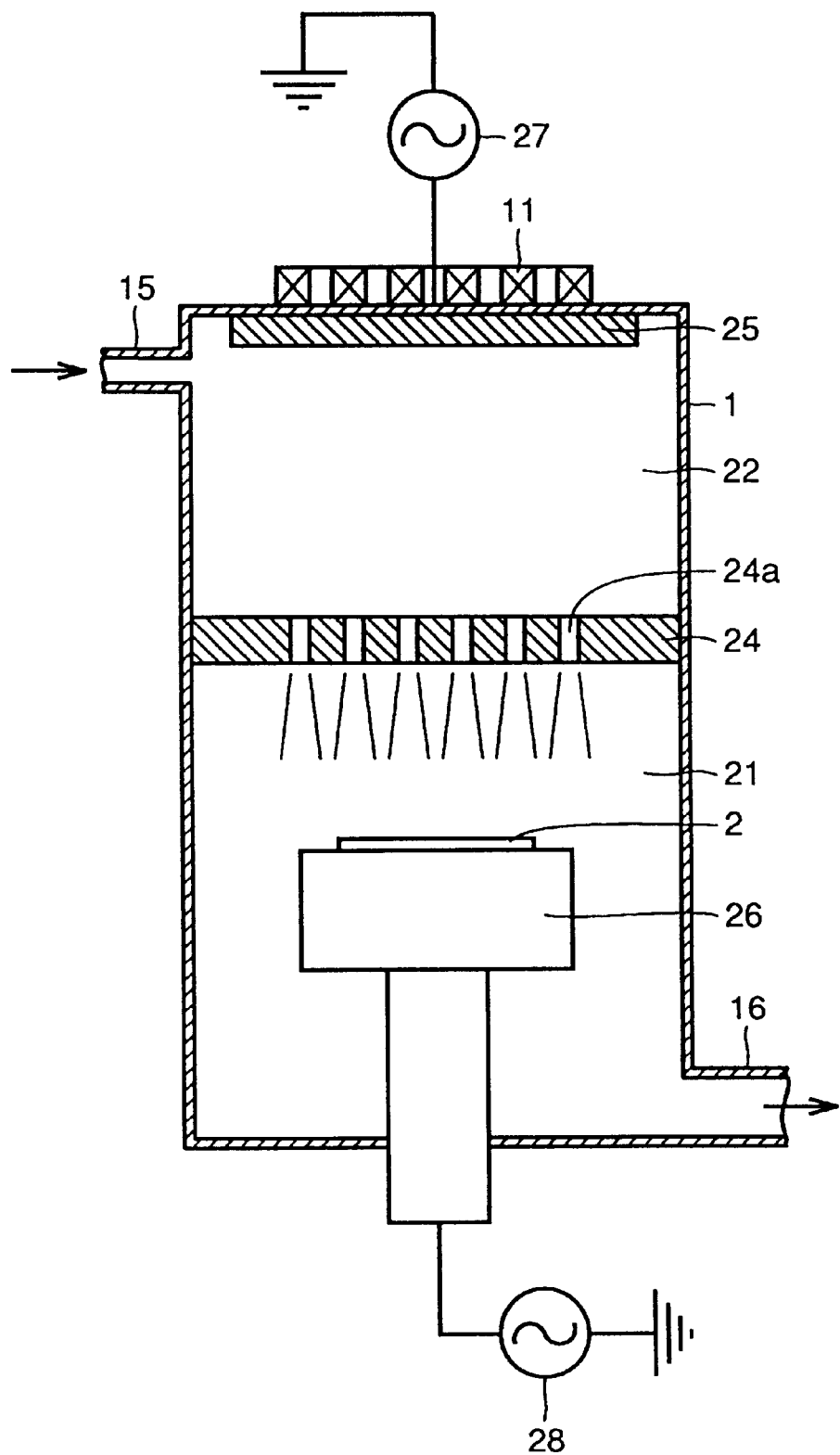
FIG. 1 is a sectional view of a structure of a plasma dry etching apparatus according to a first embodiment of the present invention.

Referring to FIG. 1, a processing chamber 21 is provided in a vacuum vessel 1 of a plasma dry etching apparatus according to the first embodiment of the present invention. A stage 26 forming a first electrode on which an object 2 to be processed is placed is provided in processing chamber 21. High frequency power is supplied to stage 26 by a high frequency power source 28. A plasma generation chamber 22 is also provided in vacuum vessel 1. A partition panel 24 is provided between processing chamber 21 and plasma generation chamber 22. A plurality of holes 24a are formed in partition panel 24.

Etching gas is supplied into plasma generation chamber 22 from a gas conduit 15. The etching gas supplied to plasma generation chamber 22 passes through holes 24a of partition panel 24 to be introduced into processing chamber 21. The etching gas is exhausted outside through an exhaust port 16. In discharging the etching gas outside, processing chamber 21 is evacuated by a vacuum pump not shown. Processing chamber 21 is maintained in a vacuum higher than plasma generation chamber 22.

A second electrode 25 is mounted at a side of plasma generation chamber 22 opposite partition panel 24. High frequency power is supplied to second electrode 25 by a high frequency power source 27. An annular permanent magnet 11 is arranged at the atmosphere side of second electrode 25.

According to the plasma dry etching apparatus of the above structure, etching gas introduced into plasma generation chamber 22 passes through holes 24a of partition panel 24 into processing chamber 21 and output through exhaust port 16.

By applying high frequency power to second electrode 25 of plasma generation chamber 22, ionization is promoted by the E×B drift caused by the magnetic field produced by permanent magnet 11 arranged in the proximity of second electrode 25 and the electric field. As a result, high density plasma is generated. The plasma generated at plasma generation chamber 22 is conveyed into processing chamber 21 via holes 24a of partition panel 24 to etch object 2 mounted on stage 26.

The configuration of the apparatus for etching an object of a large diameter will be described hereinafter using specific numerics. At the atmosphere side of second electrode 25 of plasma generation chamber 22, three annular permanent magnets 11 are arranged concentrically. E×B drift caused by the electric field formed in the proximity of electrode 25 and the magnetic field occurs at the neighborhood of second electrode 25. However, locally dense plasma will not be generated. This is due to the fact that annular permanent magnets are arranged. Among the magnetic field formed in the proximity of second electrode 25, the magnetic field component in the direction of the circumference of second electrode 25 is 0. Therefore, plasma can be generated uniformly over a large area.

The surface magnetic field intensity of annular permanent magnet 11 is set to 3000 gauss. The distance between respective annular permanent magnets 11 is set to 50 mm. The distance between annular permanent magnet 11 to second electrode 25 is set to 40 mm. The distance between electrode 25 and partition panel 24 is set to 80 mm.

The volume of plasma generation chamber 22 is set to 10 liters. The volume of processing chamber 21 is set to 50 liters. The effective evacuation rate is set to 100 liters/second. The total area of holes 24a in partition panel 24 is set to approximately 7.0 cm$^2$. By using Cl$_2$ gas as etching gas and setting the pressure in plasma generation chamber 22 to 5 mTorr, the atmospheric pressure in processing chamber 21 becomes approximately 1 mTorr. By carrying out discharge under the above-described conditions, the plasma density in plasma generation chamber 22 becomes approximately 5×10$^9$ (particles/cm$^3$) to 5×10$^{10}$ (particles/cm$^3$), which is one order of magnitude higher than that without a magnetic field. Processing chamber 21 is maintained at a high vacuum, so that a fine pattern can be formed.

A polysilicon material of a gate circuit in the fabrication of a semiconductor was etched using the plasma dry etching apparatus of the above structure. An object 2 of 6 inch in size could be processed at the etching rate of 100 nm/min with homogeneity of 5%.

Although not depicted, the uniformity of the etching rate can further be improved by providing a columnar permanent magnet at the center of the concentric circle of annular permanent magnets 11. In this case, the homogeneity of the magnetic field can be adjusted by setting the surface magnetic field intensity of the columnar permanent magnet higher or lower than the surface magnetic field intensity 300 gauss of the annular permanent magnet. Accordingly, uniform plasma can be generated at the plasma generation chamber to allow uniform etching.

By the apparatus of the above-described size and annular permanent magnets 11 of the above-described surface magnetic field intensity, a magnetic field of at least 100 gauss in intensity is generated in plasma generation chamber 22 and a magnetic field of not more than 200 gauss in intensity is generated in the proximity of stage 26 of processing chamber 21. As a result, plasma generation is promoted by the high magnetic field in the proximity of electrode 25 in plasma generation chamber 22 to maintain plasma of high density. The magnetic field is low in the proximity of object 2 to be processed. Therefore, processing of high quality can be carried out at high speed and with less etching damage.

Second Embodiment

Figure 2:
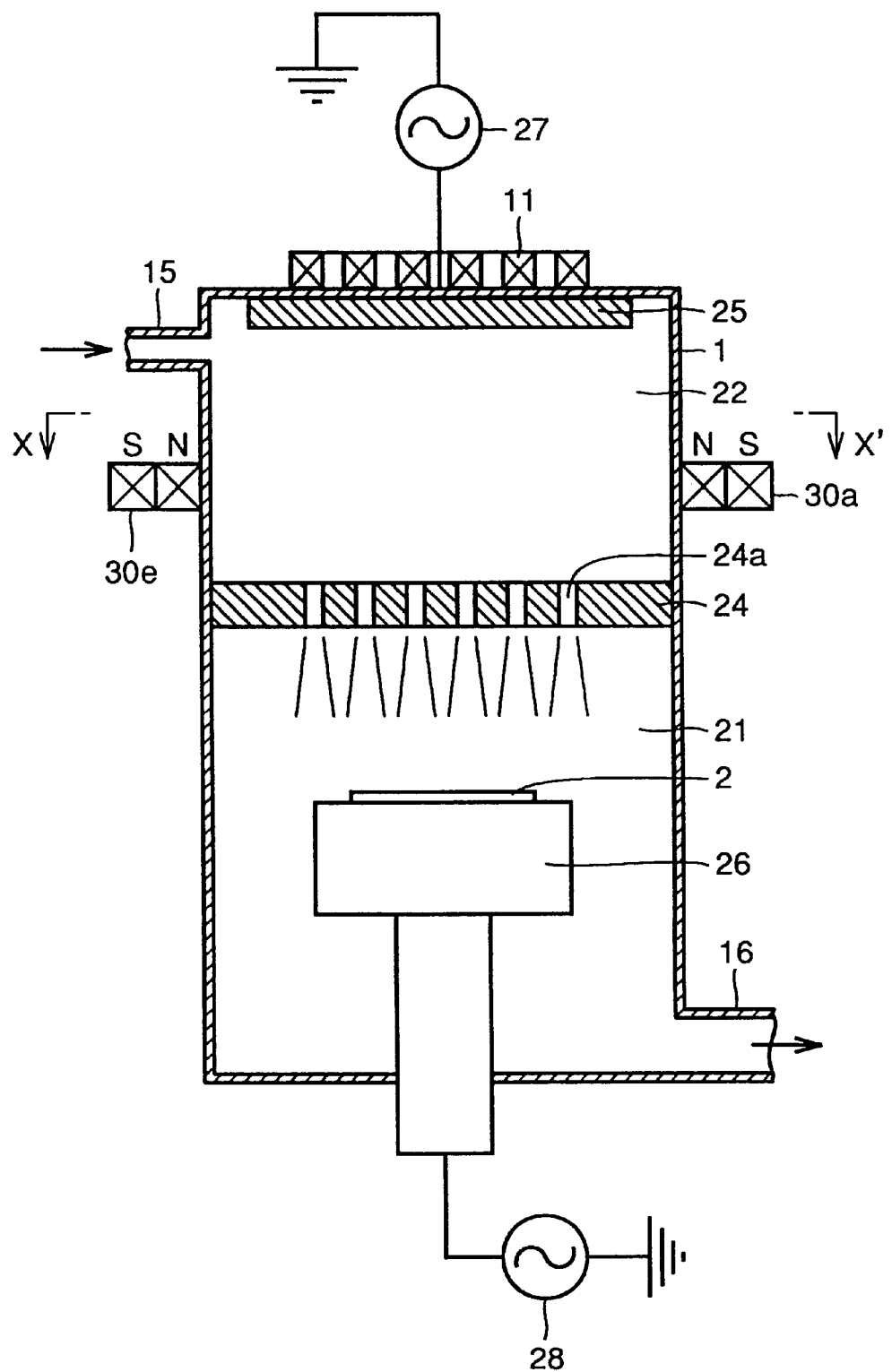
FIG. 2 is a sectional view of a structure of a plasma dry etching apparatus according to a second embodiment of the present invention.

A plasma processing apparatus according to a second embodiment of the present invention will be described hereinafter with reference to FIGS. 2 and 3.

The plasma dry etching apparatus of the second embodiment is similar in structure to the plasma dry etching apparatus of the first embodiment with the exception that permanent magnets 30a–30h are provided on the outer circumference of vacuum vessel 1 corresponding to the portion of plasma generation chamber 22. Permanent magnets 30a–30h are provided so that the N pole and S pole are arranged alternately.

Figure 3:
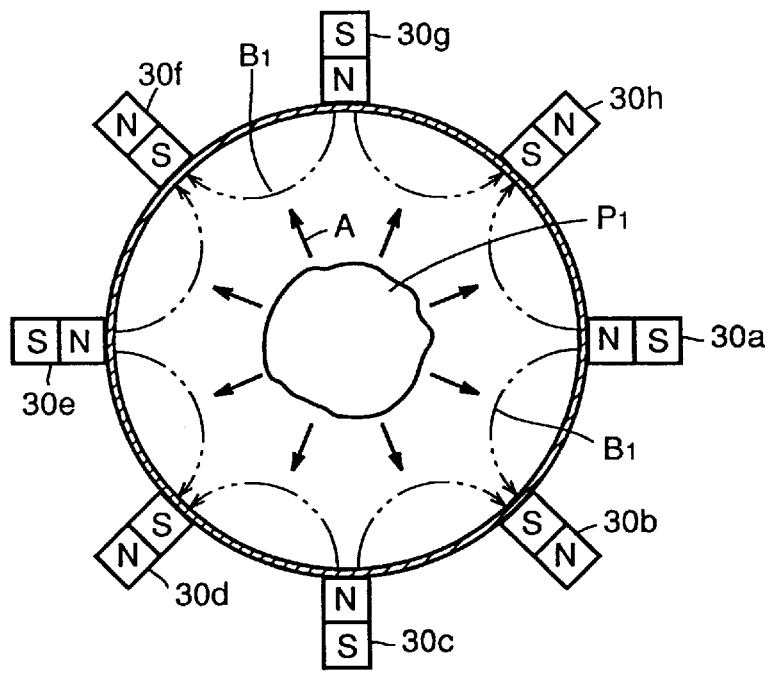
FIG. 3 is a sectional view of the plasma dry etching apparatus of FIG. 2 in the direction of arrow X-X'.

By such an arrangement of permanent magnets 30a–30h, plasma $P_1$ generated in plasma generation chamber 22 is urged in the direction indicated by arrow A in FIG. 3 by magnetic field $B_1$ produced from permanent magnets 30a–30h.

As a result, plasma diffusion towards the circumference of vacuum vessel 1 is reduced. The homogeneity of plasma in plasma generation chamber 22 can be improved than that of the plasma etching apparatus of the first embodiment. Therefore, uniform etching of higher quality can be carried out.

Third Embodiment

Figure 5:
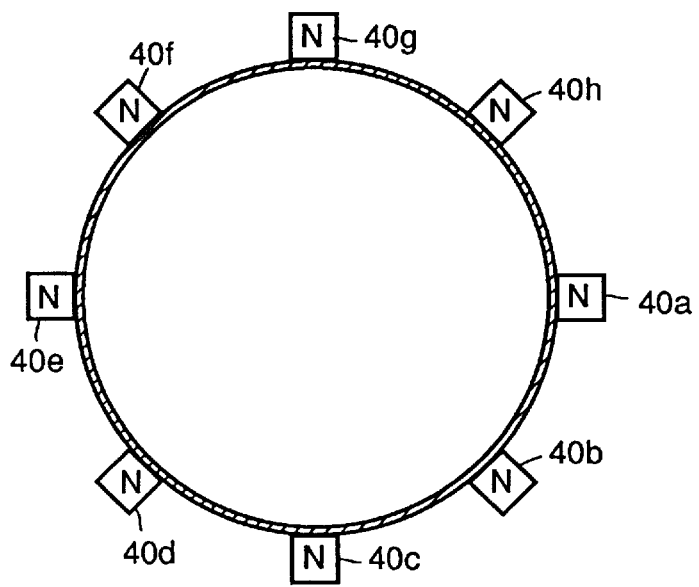
FIG. 5 is a sectional view of the plasma dry etching apparatus of FIG. 4 in the direction of arrow X-X'.

A plasma processing apparatus according to a third embodiment of the present invention will be described hereinafter with reference to FIGS. 4 and 5.

The plasma dry etching apparatus of the third embodiment is similar in structure to the plasma dry etching apparatus of the first embodiment with the exception of a plurality of permanent magnets 40a–40h provided at a predetermined pitch at the outer circumference of vacuum vessel 1 corresponding to the portion of plasma generation chamber 22. Each of permanent magnets 40a–40h has the N pole arranged at the second electrode 25 side and the S pole arranged at the stage 26 side.

Figure 4:
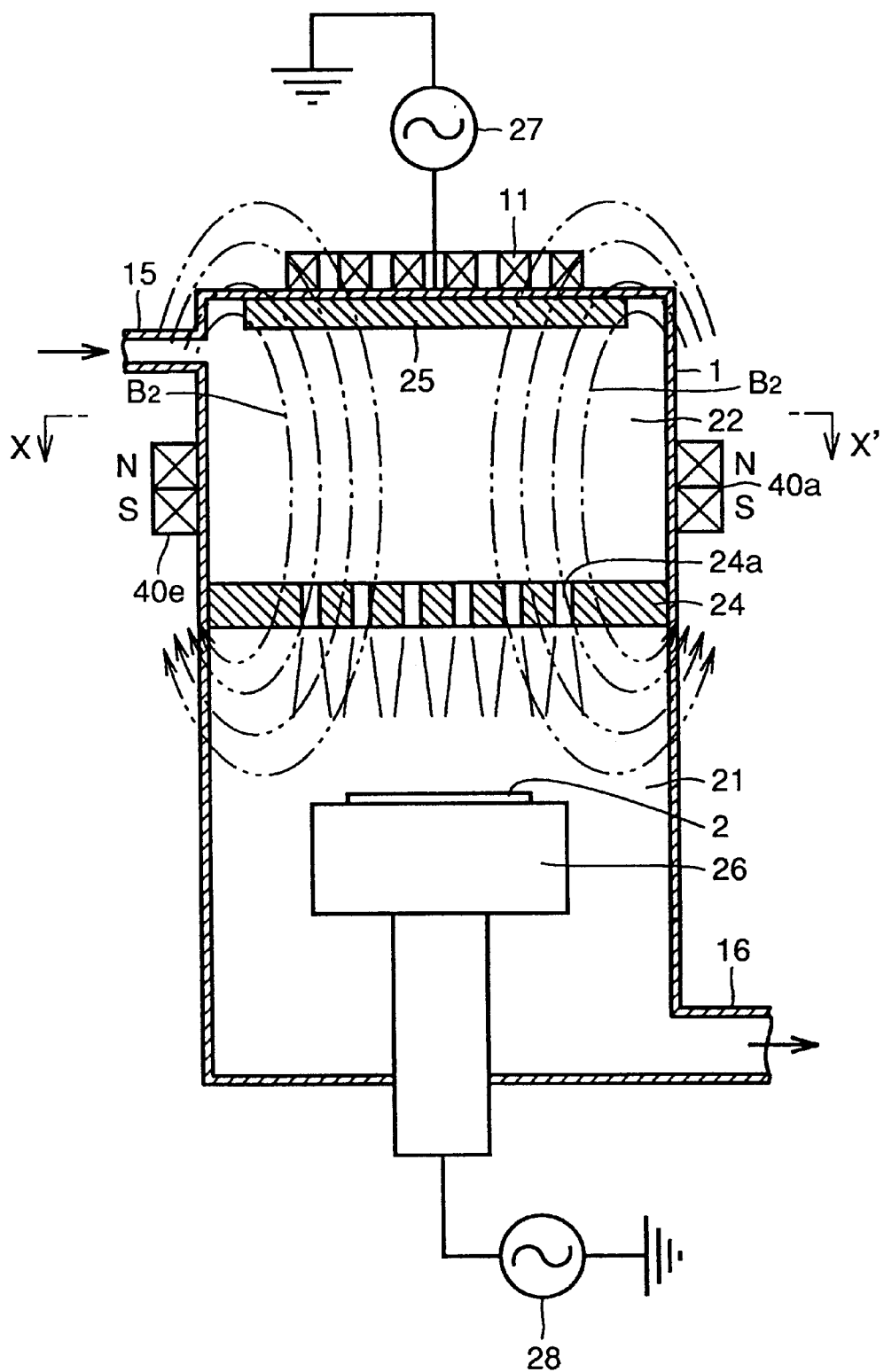
FIG. 4 is a sectional view of a structure of a plasma dry etching apparatus according to a third embodiment of the present invention.

By such an arrangement of permanent magnets 40a–40h, magnetic field $B_2$ from permanent magnets 40a–40h is generated in plasma generation chamber 22 as shown in FIG. 4. By this magnetic field $B_2$, the plasma generated in plasma generation chamber 22 is accelerated from the side of second electrode 25 to the side of stage 26.

Figure 6:
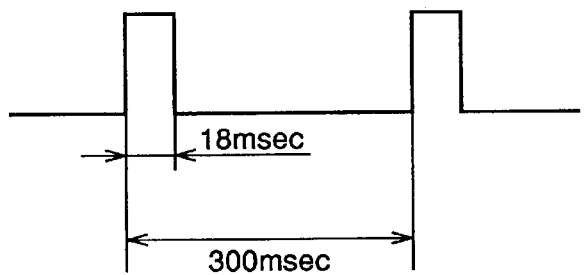
FIG. 6 shows the introduction condition of etching gas.

An example of the process conditions for etching polysilicon according to the plasma dry etching apparatus of the structure shown in FIG. 4 is set forth in the following. The voltage of high frequency power source 27 applied to second electrode 25 of plasma generation chamber 22 is set to 900 W. The voltage of high frequency power source 28 applied to stage 26 in processing chamber 21 is set to 500 W. The gas supply timing is effected at a cycle time of 300 msec with an ON state of 18 msec as shown in FIG. 6. The average flow rate of introduced gas $Cl_2$ is set to approximately 70 sccm. The pressure of plasma generation chamber 22 is set to approximately 18 mTorr. The pressure of processing chamber 21 is set to approximately 1 mTorr. In contrast to the etching rate of 65 nm/min with the plasma dry etching apparatus of the first embodiment where the magnetic field intensity $B_2$ above partition panel 24 is 0 (Gauss), the etching rate increases to 85 nm/min according to the plasma dry etching apparatus of the present third embodiment.

Fourth Embodiment

Figure 7:
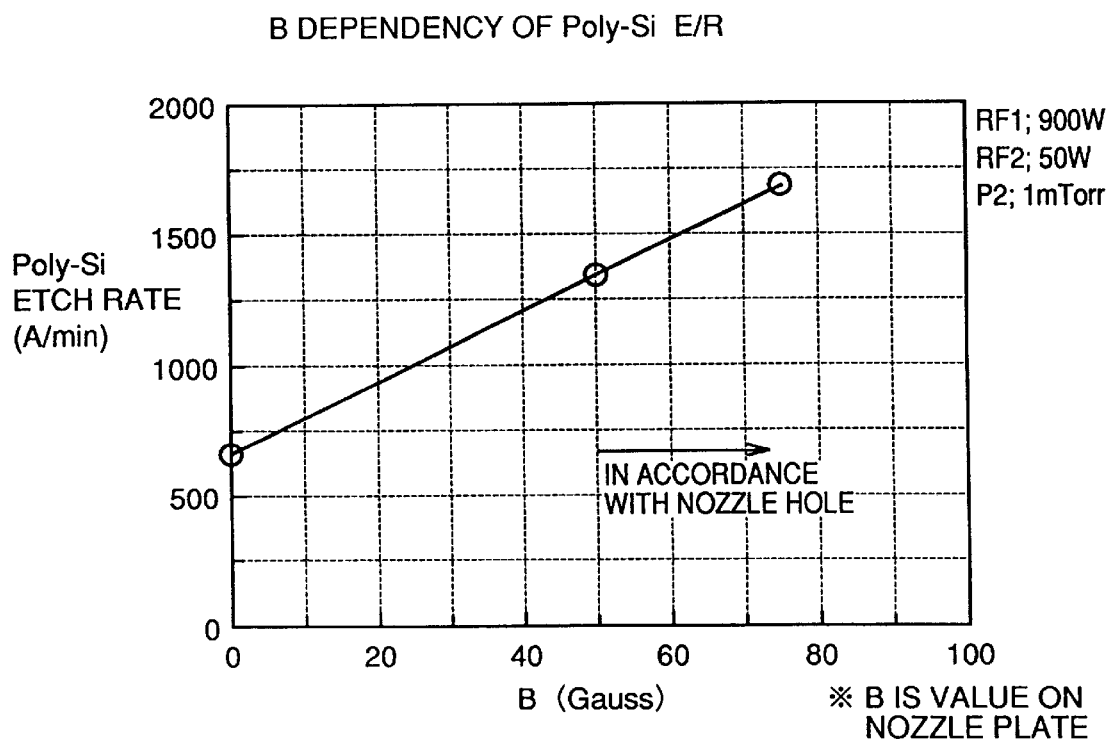
FIG. 7 shows the effect of a plasma dry etching apparatus according to a fourth embodiment of the present invention.
Figure 8:
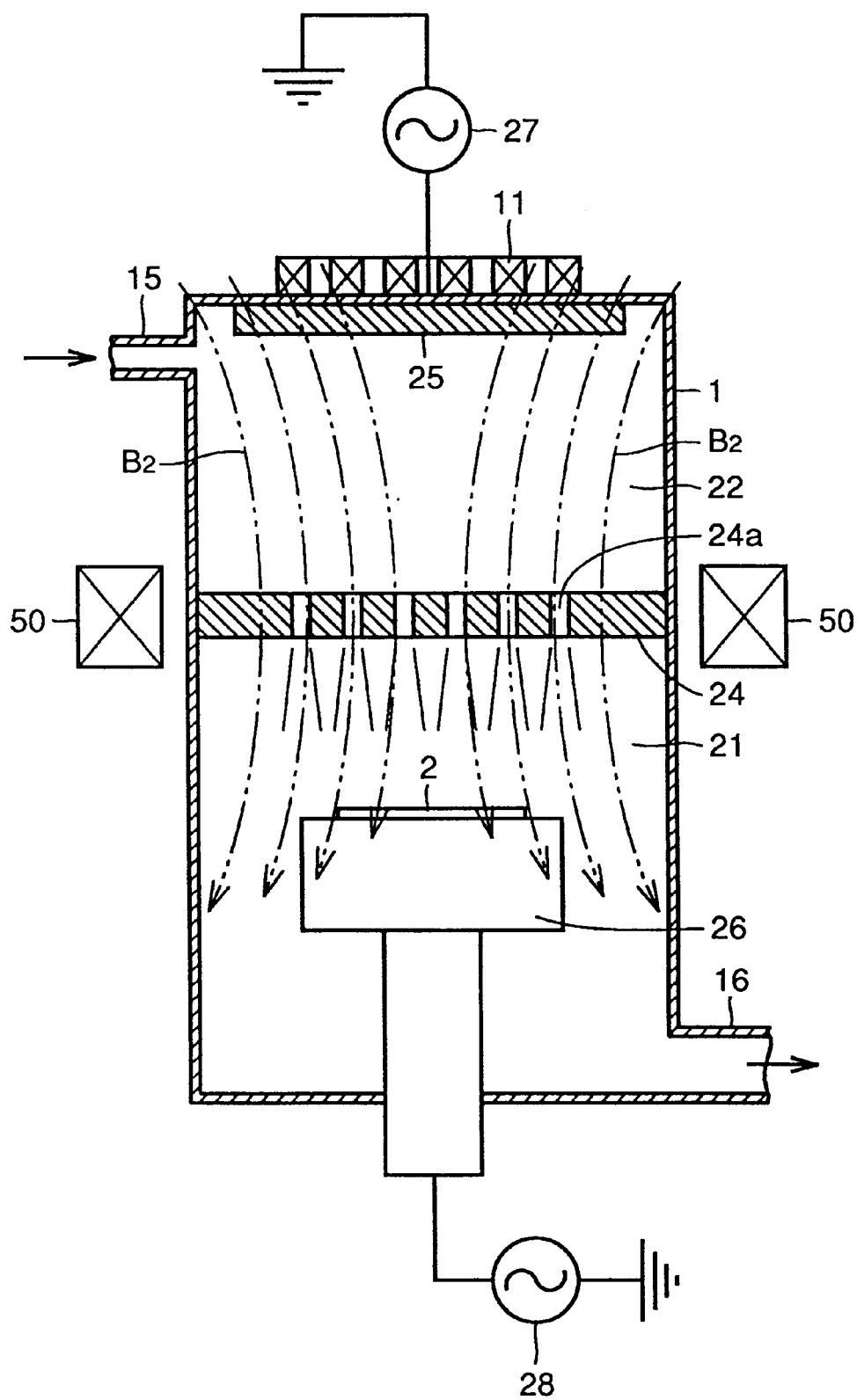
FIG. 8 is a sectional view showing a structure of the plasma dry etching apparatus according to the fourth embodiment of the present invention.
Figure 9:
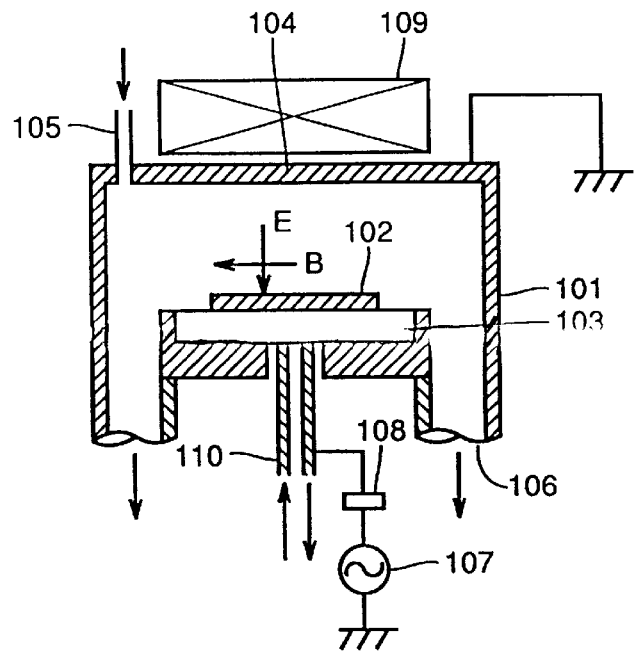
FIG. 9 is a sectional view of a plasma processing apparatus according to a first conventional example.
Figure 10A:
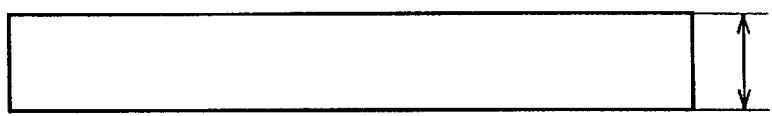
FIG. 10(A) shows a sides view of a permanent magnet of the plasma processing apparatus of FIG. 9.
Figure 10B:
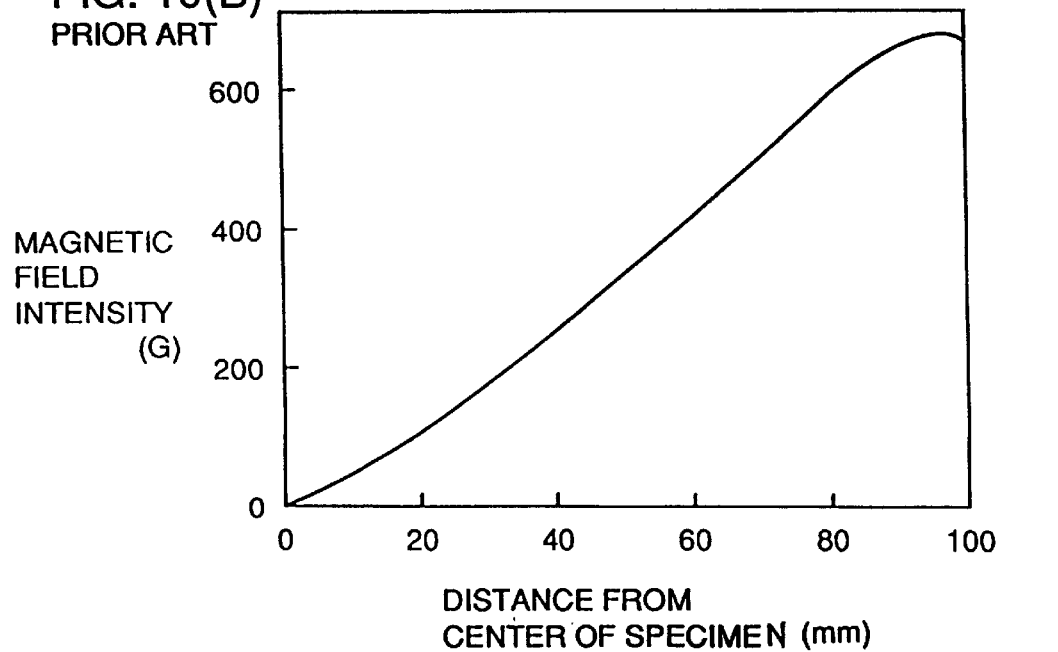
FIG. 10(B) shows magnetic field distribution of the permanent magnet of FIG. 10(A).
Figure 11A:
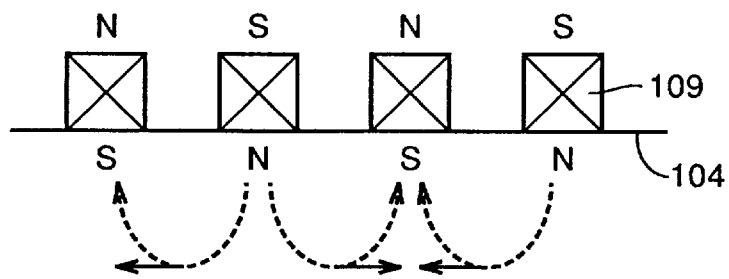
FIGS. 11(A) and 11(B) are schematic diagrams showing the drift of plasma in conventional art.
Figure 11B:
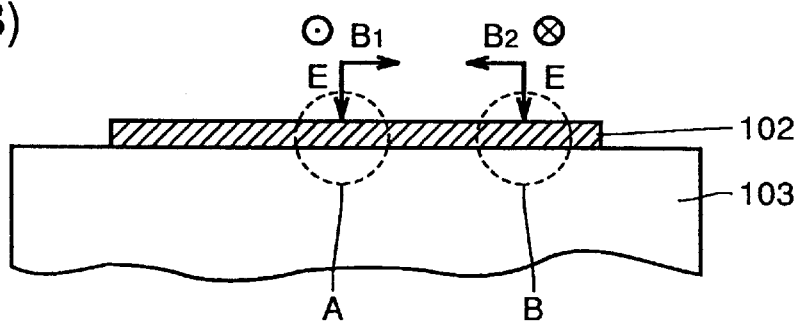
Figure 12A:
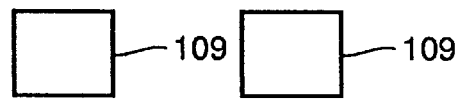
FIGS. 12(A) and 12(B) show the radial distribution of magnetic flux density B ⊥ in the lateral direction at the surface of the second electrode of the plasma processing apparatus of conventional art.
Figure 12B:
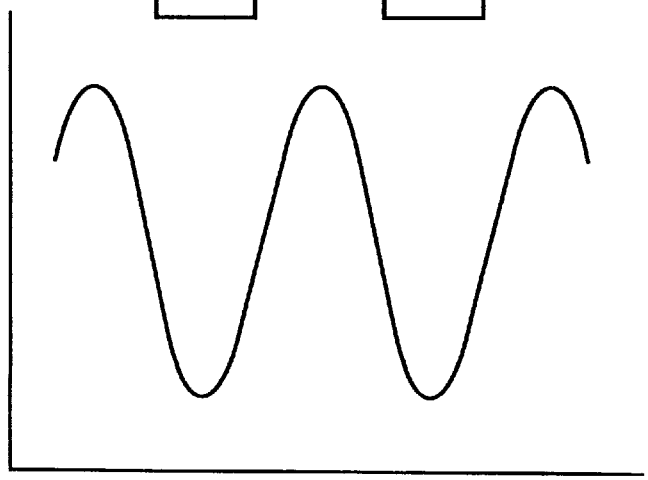
Figure 13:
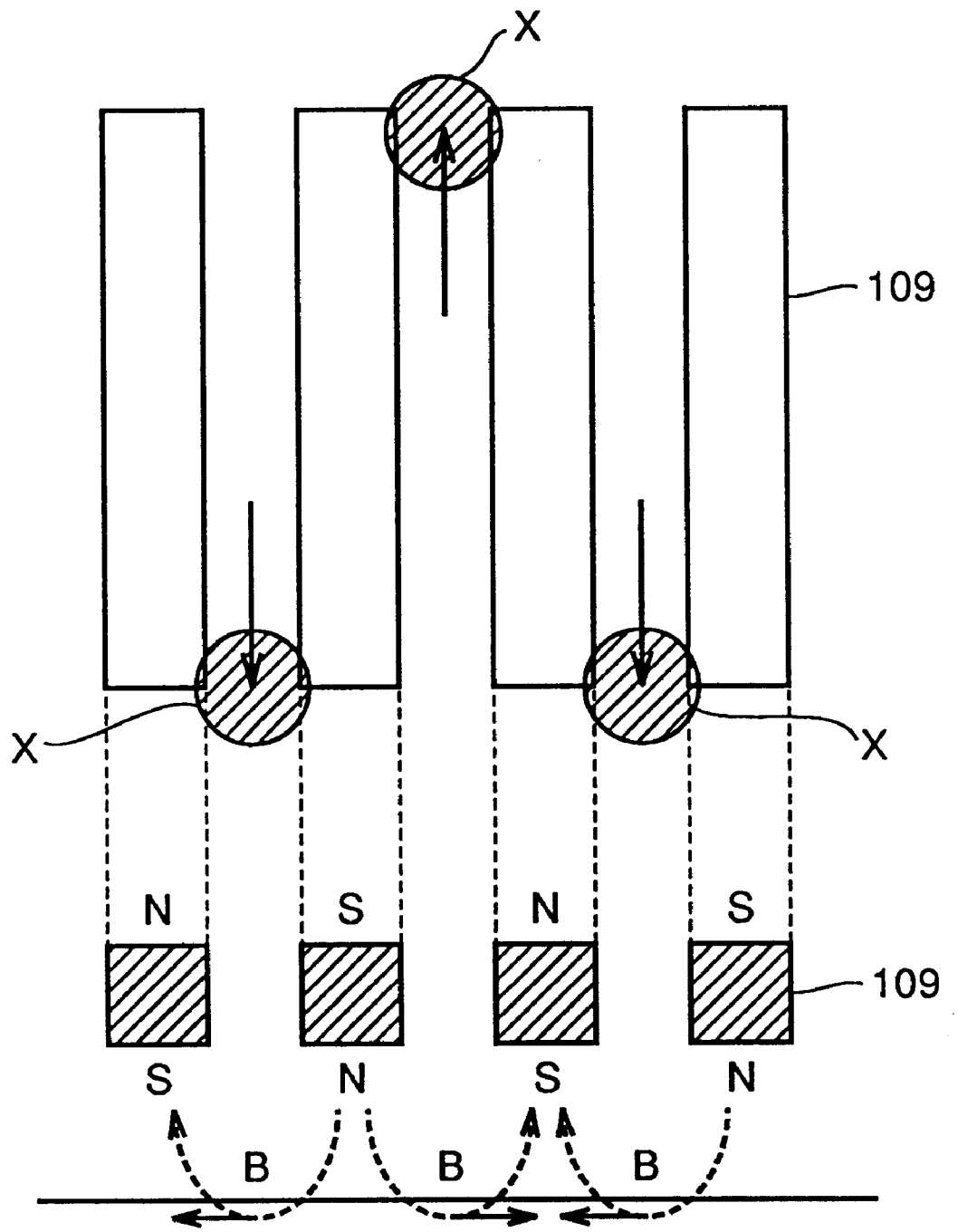
FIG. 13 is a diagram for describing plasma drift in a plasma processing apparatus of another conventional example.
Figure 14:
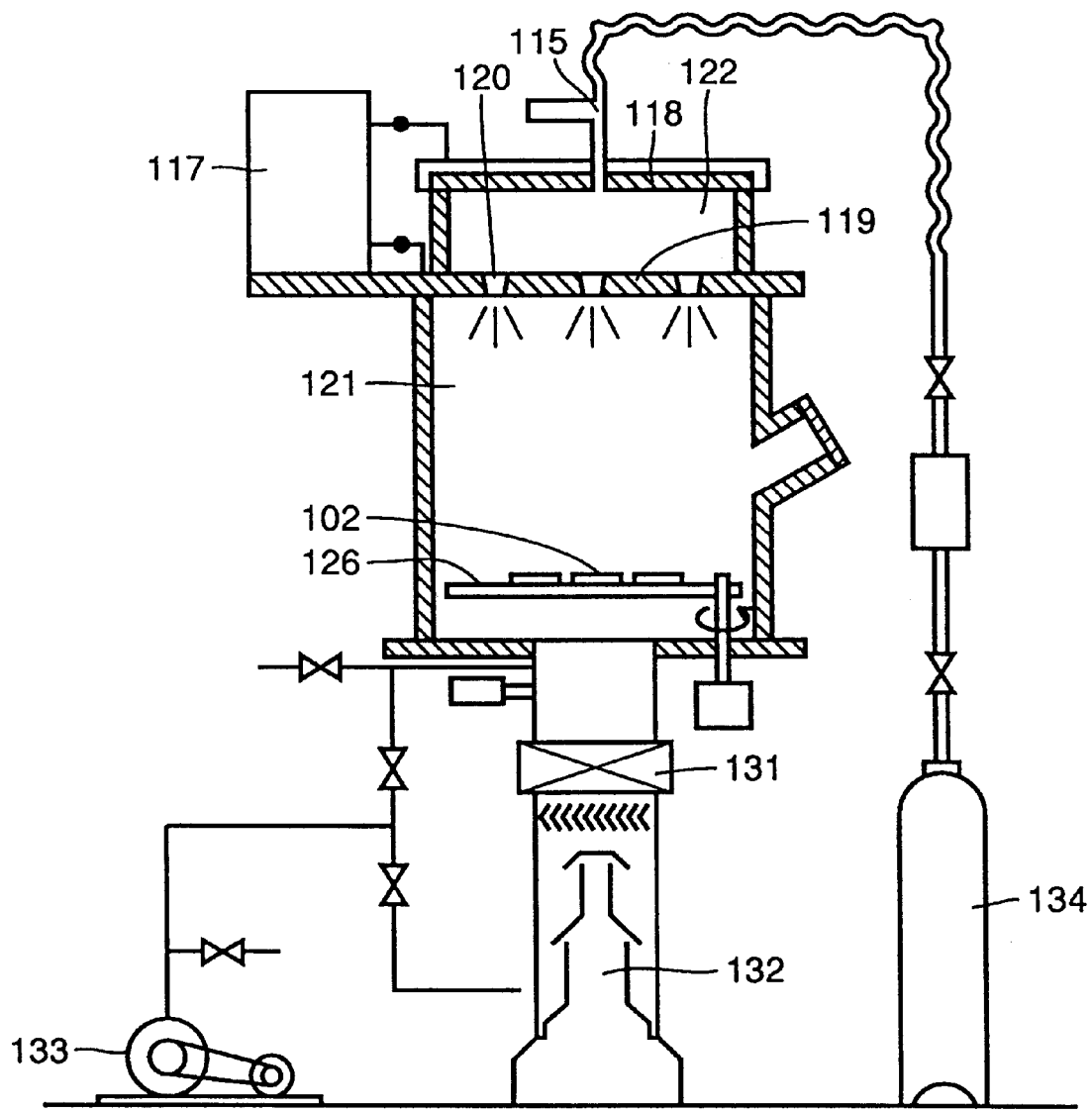
FIG. 14 schematically shows a structure of a dry etching apparatus of a conventional plasma processing apparatus.

A plasma processing apparatus according to a fourth embodiment of the present invention will be described hereinafter with reference to FIGS. 7 and 8.

The plasma dry etching apparatus of the fourth embodiment is similar in structure to the plasma dry etching apparatus of the third embodiment with the exception that a divergent magnetic field coil 50 is arranged on the outer circumference of vacuum vessel 1 corresponding to the portion of partition panel 24 instead of permanent magnets 40a–40h. The provision of divergent magnetic field coil 50 allows generation of magnetic field $B_2$ within plasma generation chamber 22 as in the third embodiment. The plasma generated in plasma generation chamber 22 can be directed to processing chamber 21 at a high density state. As shown in FIG. 7, the etching rate increases by altering the magnetic field intensity $B_2$ above partition panel 24 corresponding to the magnetic field generated by divergent magnetic field coil 50. In contrast to the etching rate of 65 nm/min with the magnetic field intensity of 0 Gauss, the etching rate of 170 nm/min can be achieved with the magnetic field intensity of 75 Gauss.

Although the above first to fourth embodiments have been described for a parallel-plate type plasma generation apparatus for producing plasma, the present invention is not limited to this type. For example, a similar effect can be obtained using a plasma generation apparatus such as of an inductive coupling type, an ECR type, a magnetron type, and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:

a processing chamber having a first electrode on which an object to be processed is mounted in a vacuum vessel;

a plasma generation chamber having a second electrode arranged opposite to said first electrode in said vacuum vessel, wherein a pressure of said plasma generation chamber is higher than a pressure of said processing chamber;

a partition panel provided between said processing chamber and said plasma chamber, and having a hole communicating from said plasma generation chamber to said processing chamber, wherein an outer circumference of said partition panel is attached to an inner wall of said vacuum vessel with no gap therebetween;

a magnetic field generation device provided outside said vacuum vessel for generating a magnetic field within said vacuum vessel, wherein said magnetic field generation device has a plurality of permanent magnets arranged on an outer circumference of said vacuum vessel at said plasma generation chamber, said permanent magnets having the N pole arranged at the second electrode side and the S pole arranged at the first electrode side.

2. The plasma processing apparatus according to claim 1, wherein a process gas is supplied intermittently into said plasma generation chamber.

3. A plasma processing apparatus comprising:

a processing chamber having a first electrode on which an object to be processed is mounted in a vacuum vessel;

a plasma generation chamber having a second electrode arranged opposite to said first electrode in said vacuum vessel, wherein a pressure of said plasma generation chamber is higher than a pressure of said processing chamber;

a partition panel provided between said processing chamber and said plasma chamber, and having a hole communicating from said plasma generation chamber to said processing chamber, wherein an outer circumference of said partition panel is attached to an inner wall of said vacuum vessel with no gap therebetween; and a magnetic field generation device provided outside said vacuum vessel for generating a magnetic field within said vacuum vessel, and including a divergent magnetic field coil on an outer circumference of said vacuum vessel at said partition panel.

4. The plasma processing apparatus according to claim 3, wherein a process gas is supplied intermittently into said plasma generation chamber.

* * * * *